United States Patent [19]
Ishii

[11] Patent Number: 4,583,052
[45] Date of Patent: Apr. 15, 1986

[54] AMPLIFIER HAVING COMPLETE ISOLATION OF POWER SOURCES

[75] Inventor: Satoshi Ishii, Tokyo, Japan

[73] Assignee: Pioneer Electronic Corporation, Tokyo, Japan

[21] Appl. No.: 601,519

[22] Filed: Apr. 18, 1984

[30] Foreign Application Priority Data

Apr. 26, 1983 [JP] Japan .................. 58-74325

[51] Int. Cl.⁴ .................. H03F 3/04; H03F 1/34
[52] U.S. Cl. .................. 330/297; 330/253; 330/255; 330/260; 330/300; 330/308
[58] Field of Search .................. 330/59, 200, 202, 253, 330/255, 260, 297, 300, 310, 308

[56] References Cited

U.S. PATENT DOCUMENTS

| | | | |
|---|---|---|---|
| 3,811,094 | 5/1974 | Lee | 330/59 |
| 3,893,037 | 7/1975 | Herbert | 330/59 |
| 3,987,369 | 10/1976 | Yokoyama | 330/255 X |
| 4,079,333 | 3/1978 | Yamada | 330/200 X |

Primary Examiner—James B. Mullins
Attorney, Agent, or Firm—Sughrue, Mion, Zinn, Macpeak and Seas

[57] ABSTRACT

An amplifier operating from a plurality of power sources in which current flows through ground loops between power sources supplying operating power to different stages are eliminated. The output of a voltage amplifying stage is applied to a high input impedance buffer input circuit of a following buffer amplifying stage. The output of the power amplifying stage is voltage divided and applied to a feedback buffer circuit, the output of which is applied to an inverting input terminal of the voltage amplifying stage. Accordingly, due to the high impedance of the input of the power amplifying stage and of the feedback buffer, substantially no currents flow between the stages, hence eliminating ground current flows.

11 Claims, 8 Drawing Figures

AMPLIFIER HAVING COMPLETE ISOLATION OF POWER SOURCES

BACKGROUND OF THE INVENTION

The present invention relates to an amplifier operating from a plurality of power source systems in which there is no current flow between the power source systems.

An example of an amplifier operating from a plurality of power sources is shown in FIG. 1. In FIG. 1, reference symbols $+V_1$ and $-V_1$ designate voltage amplifying stage power sources, and $+V_2$ and $-V_2$ power amplifying stage power sources. A bias resistor $R_1$ is connected between input terminals 1 and 1'. The terminal 1 is connected to the gate of an FET $Q_1$. The FET $Q_1$ and an FET $Q_2$ form a differential amplifier circuit. The sources of the FETs are connected together and are connected to a constant current source $I_1$. The drain of the FET $Q_1$ is connected to one terminal of a load resistor $R_2$ and to the base of a transistor $Q_3$. The other terminal of the load resistor $R_2$ and the emitter of the transistor $Q_3$ are connected to the power source $+V_1$. The collector of the transistor $Q_3$ is connected to a constant current source $I_2$, and also to the base of a transistor $Q_4$. The transistor $Q_4$ and a transistor $Q_5$ are Darlington connected. The emitters of the transistors $Q_4$ and $Q_5$ are connected to constant current sources $I_3$ and $I_4$, respectively, and the collectors thereof are connected to the power source $+V_2$. The emitter of the transistor $Q_5$ is connected through a resistor $R_3$ to the gate of the FET $Q_2$. A resistor $R_4$ is connected between the gate of the FET $Q_2$ and the terminal 1'. The connecting point of the power sources $+V_1$ and $-V_1$ is connected to the input terminal 1' and is grounded at a grounding point $G_1$. The emitter of the transistor $Q_5$ is connected to a terminal 2 which is connected to one terminal of a load 3, the other terminal of which is connected to a terminal 2'. The terminal 2' is connected to the connecting point of the power sources $+V_2$ and $-V_2$ and is grounded at a grounding point $G_2$. The grounding points $G_1$ and $G_2$ are connected together through a ground bus or chassis. Further in FIG. 1, reference numeral 4 designates a voltage amplifying stage, and 5 a power amplifying stage.

The operation of the amplifier thus arranged will be described.

The circuit is fundamentally a negative feedback amplifier. If the loop gain is sufficiently high, then the closed loop voltage gain can be represented substantially by $(R_3+R_4)/R_4$.

Currents flow in the circuit as follows: The base current (signal current) of the transistor $Q_4$ flows from the power source $+V_1$ through the transistor $Q_3$, the base and emitter of the transistor $Q_4$ and the base and emitter of the transistor $Q_5$ to the load 3, and it returns from the load 3 through the terminal 2', the connecting point of the power source $+V_2$ and $-V_2$ and the grounding points $G_2$ and $G_1$ to the connecting point of the power sources $+V_1$ and $-V_1$. Similarly, almost all the current flowing in the feedback resistors $R_3$ and $R_4$ flows as indicated by a route $i_2$ in FIG. 1: the power source $+V_2$—the transistor $Q_5$—the resistor $R_3$—the resistor $R_4$—the grounding point $G_1$—the grounding point $G_2$.

In the conventional amplifier constructed as described above, if there is some nonzero impedance between the grounding points $G_1$ and $G_2$, a potential difference is produced between the grounding points which adversely affects amplification of the signal. In the case of the negative feedback amplifier, the magnitude of the current $i_1$ is set in such a manner as to correct the nonlinearity of the transistors $Q_4$ and $Q_5$, and therefore, the current $i_1$ itself includes considerable nonlinear components. Accordingly, the potential difference between the grounding points $G_1$ and $G_2$ causes a serious problem. Especially in an audio power amplifier, the input voltage is often very low, and accordingly even a small potential difference between the grounding points $G_1$ and $G_2$ adversely affects the performance and harms the tone quality.

Instead of the transistor $Q_4$, an FET $Q_4$ may be employed as shown in FIG. 2. In this case, usually cascade connection is employed by using a transistor $Q_6$. However, the circuit thus modified suffers from the same difficulties as the circuit in FIG. 1 because little gate current flows in the FET $Q_4$ but the same current $i_1$ flows to the base of the transistor $Q_6$.

SUMMARY OF THE INVENTION

Accordingly, an object of the present invention is to eliminate the above-described difficulties accompanying a conventional amplifier.

In accordance with the above and other objects, the invention provides an amplifier in which an element such as an FET is provided for preventing the flow of current to the following stage. The FET is arranged between the current loops of the power source system so that the current loops are isolated from each other, whereby the effect of the nonzero impedance of the ground bus or chassis is eliminated.

DESCRIPTION OF THE PREFERRED EMBODIMENTS

Figure 1:
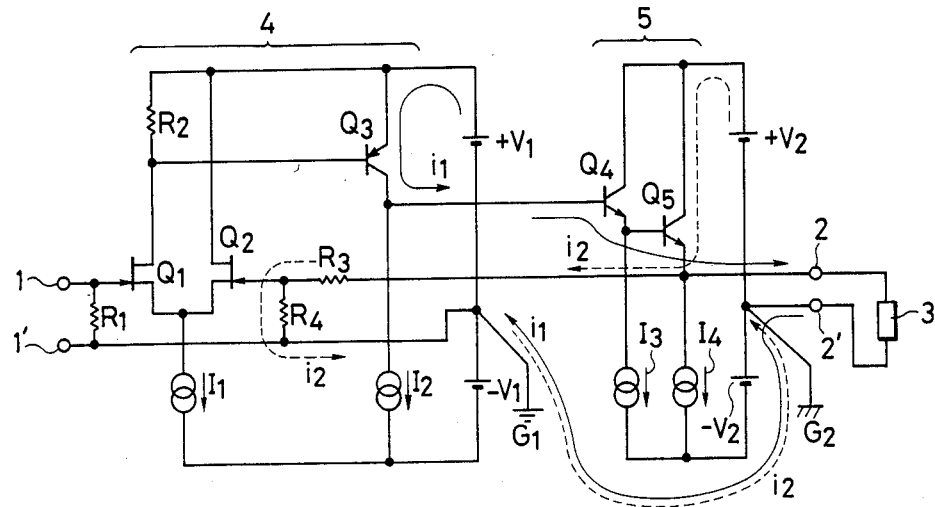
FIG. 1 is a circuit diagram showing an example of a conventional amplifier.
Figure 2:
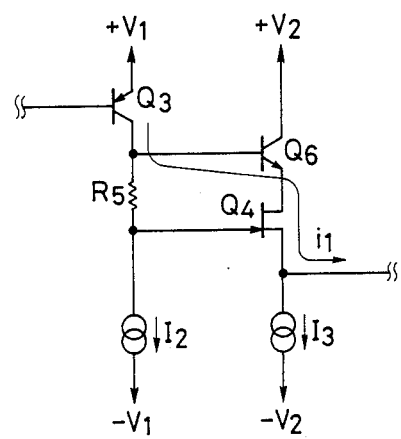
FIG. 2 is a circuit diagram showing a modification of a part of the amplifier of FIG. 1.

The invention will be described with reference to preferred embodiments shown in the drawings.

Figure 3:
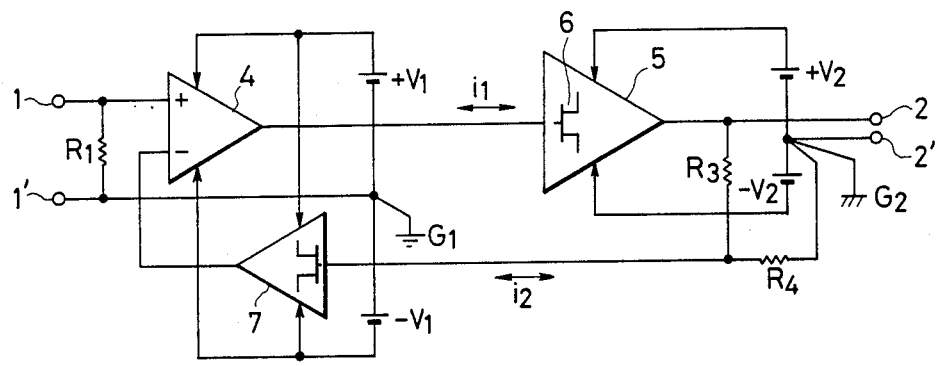
FIG. 3 is a block diagram showing a first preferred embodiment of the invention.

FIG. 3 is a block diagram showing a first preferred embodiment of the invention. A signal applied across input terminals 1 and 1' is supplied to a voltage amplifying stage 4, the output of which is applied to a power amplifying stage 5 having an FET input buffer 6 on its input side. The output of the power amplifying stage 5 is applied to output terminals 2 and 2', and is subjected to voltage division by resistors $R_3$ and $R_4$. The divided voltage is applied to an FET input buffer 7, the output of which is applied to the inverting input terminal of the voltage amplifying stage 4. The "cold" input terminal 1' is grounded at a grounding point $G_1$. The connecting point of the power sources $+V_1$ and $-V_1$ provided for the voltage amplifying stage 4 and the FET input buffer 7 is also grounded at the grounding point $G_1$. The connecting point of the power sources $+V_2$ and $-V_2$, one terminal of the resistor $R_4$, and the "cold" output terminal 2' are grounded at a grounding point $G_2$. A bias resistor $R_1$ is connected between the input terminals 1 and 1'.

The operation of the amplifier thus arranged will be described. The signal current $i_1$ flowing between the voltage amplifying stage 4 and the power amplifying stage 5 is substantially zero because of the presence of the FET input buffer 6. Furthermore, the current $i_2$ flowing from the output 2 to the FET input buffer 7 is also substantially zero. That is, the power sources $+V_1$ and $-V_1$ and the power sources $+V_2$ and $-V_2$ are completely isolated from each other, and no current flows between the grounding points $G_1$ and $G_2$. Accordingly, even if there is a large impedance between the grounding points $G_1$ and $G_2$, and even if that impedance is nonlinear, the grounding points $G_1$ and $G_2$ are maintained at the same potential, and the gain and linearity of the amplifier are not affected at all.

Figure 4:
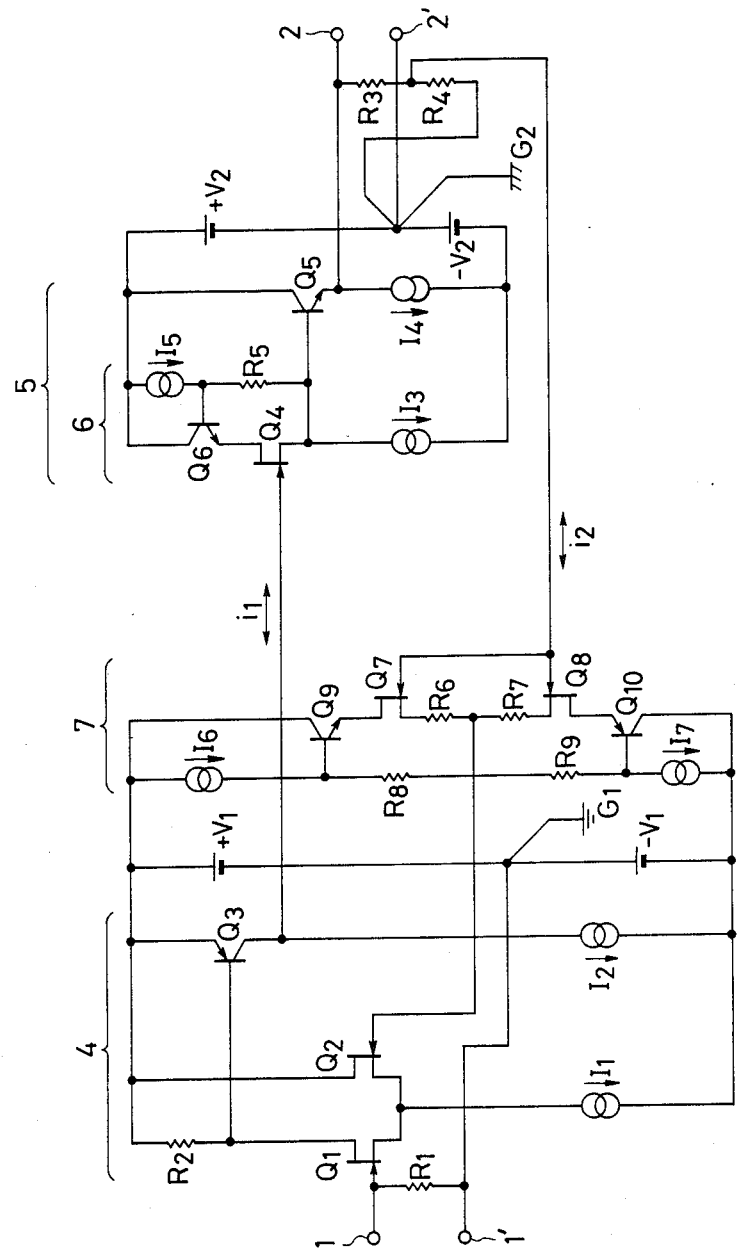
FIG. 4 is a circuit diagram showing a more specific example of an amplifier of the invention.

FIG. 4 shows a specific example of an amplifier obtained by applying the technical concept of the invention to the circuit in FIG. 1. The input circuit of the power amplifying stage 5 is formed by a buffer 6 with an FET $Q_4$. A transistor $Q_6$ is cascade connected using a constant current source $I_5$ and a resistor $R_5$ to prevent the mirror effect due to the gate-drain capacitance of the FET $Q_4$. In FIG. 4, an FET input buffer 7 is formed by FETs $Q_7$ and $Q_8$, constant current sources $I_6$ and $I_7$, and resistors $R_6$, $R_7$, $R_8$ and $R_9$. With this arrangement, the currents $i_1$ and $i_2$ are substantially zero, and accordingly no current flows between the grounding terminals $G_1$ and $G_2$.

Figure 5:
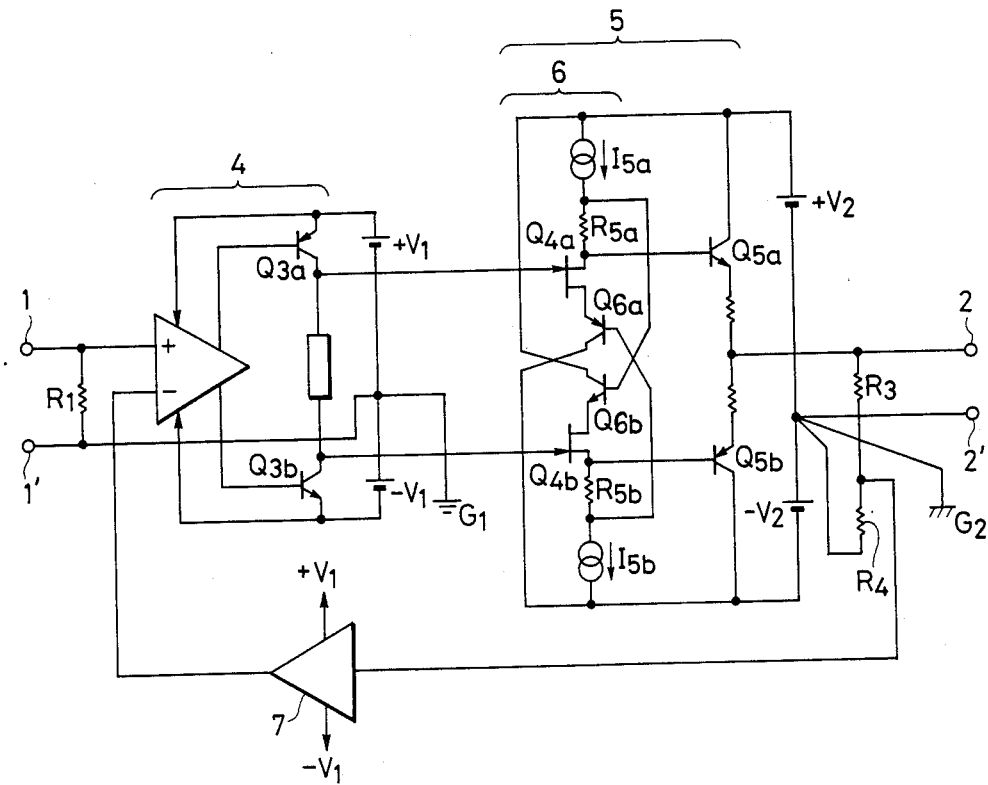
FIGS. 5 through 8 are circuit diagrams, partly as block diagrams, showing other embodiments of the invention.

In the circuit shown in FIG. 4, the output circuit of the power amplifying stage 5 is the emitter-follower circuit of the transistor $Q_5$. However, it may be a push-pull circuit formed by transistors $Q_{5a}$ and $Q_{5b}$ as shown in FIG. 5. In FIG. 5, the outputs of transistors $Q_{3a}$ and $Q_{3b}$ are applied to a buffer 6 composed of FETs $Q_{4a}$ and $Q_{4b}$. As in the case of FIG. 4, transistors $Q_{6a}$ and $Q_{6b}$ are cascade connected to the FETs $Q_{4a}$ and $Q_{4b}$ via constant current sources $I_{5a}$ and $I_{5b}$ and resistors $R_{5a}$ and $R_{5b}$ to prevent the mirror effect. The outputs of the buffer 6 are supplied to the push-pull connected transistors $Q_{5a}$ and $Q_{5b}$.

Figure 6:
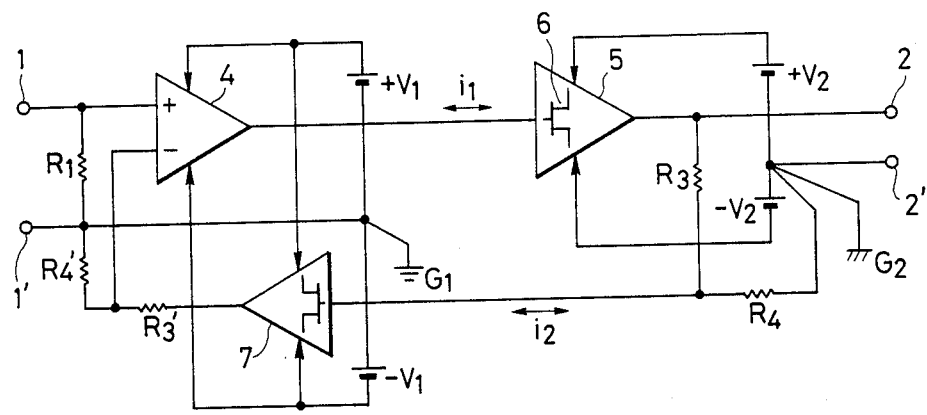

In the above-described circuits, the voltage divided by the resistors $R_3$ and $R_4$ on the output side of the power amplifying stage is applied to the buffer 7. In addition to this, as shown in FIG. 6, a resistor $R_3'$ and a resistor $R_4'$ may be connected respectively between the output terminal of the FET input buffer 7 and the inverting input terminal of the voltage amplifying stage 4 and between the same inverting input terminal and the "cold" input terminal 1' so that a division voltage provided by the resistors $R_3'$ and $R_4'$ is applied to the inverting input terminal of the voltage amplifying stage 4.

Figure 7:
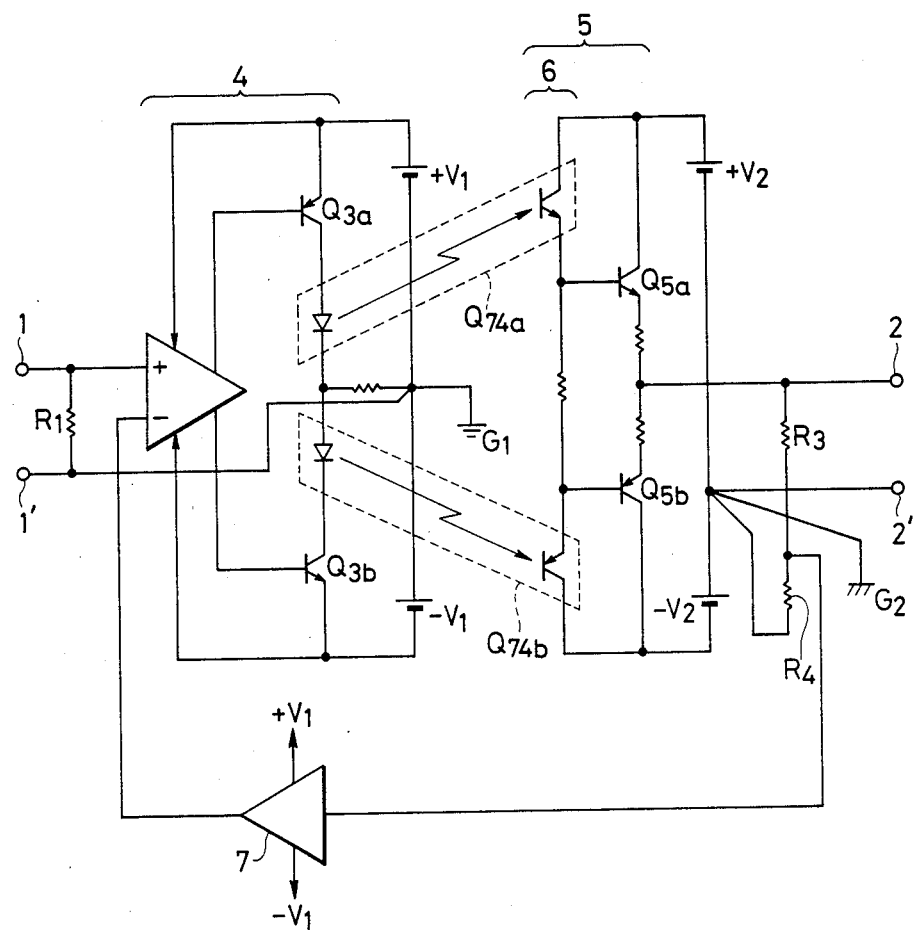

In the above-described embodiments of the invention, the buffers 6 and 7 are implemented with FETs in view of the fact that the gate current of an FET is substantially zero. The same effect can be obtained by, as shown in FIG. 7, optically coupling the voltage amplifying stage and the power amplifying stage using photocouplers $Q_{74a}$ and $Q_{74b}$ and optical cables.

In the above-described amplifiers, the circuit is divided into a voltage amplifying stage and a power amplifying stage. However, the invention is not limited thereto or thereby. That is, the objects of the invention can be achieved by the provision of an amplifier in which a current loop is formed for each of the power source systems so that the flows of current between the power source systems are made substantially zero.

Figure 8:
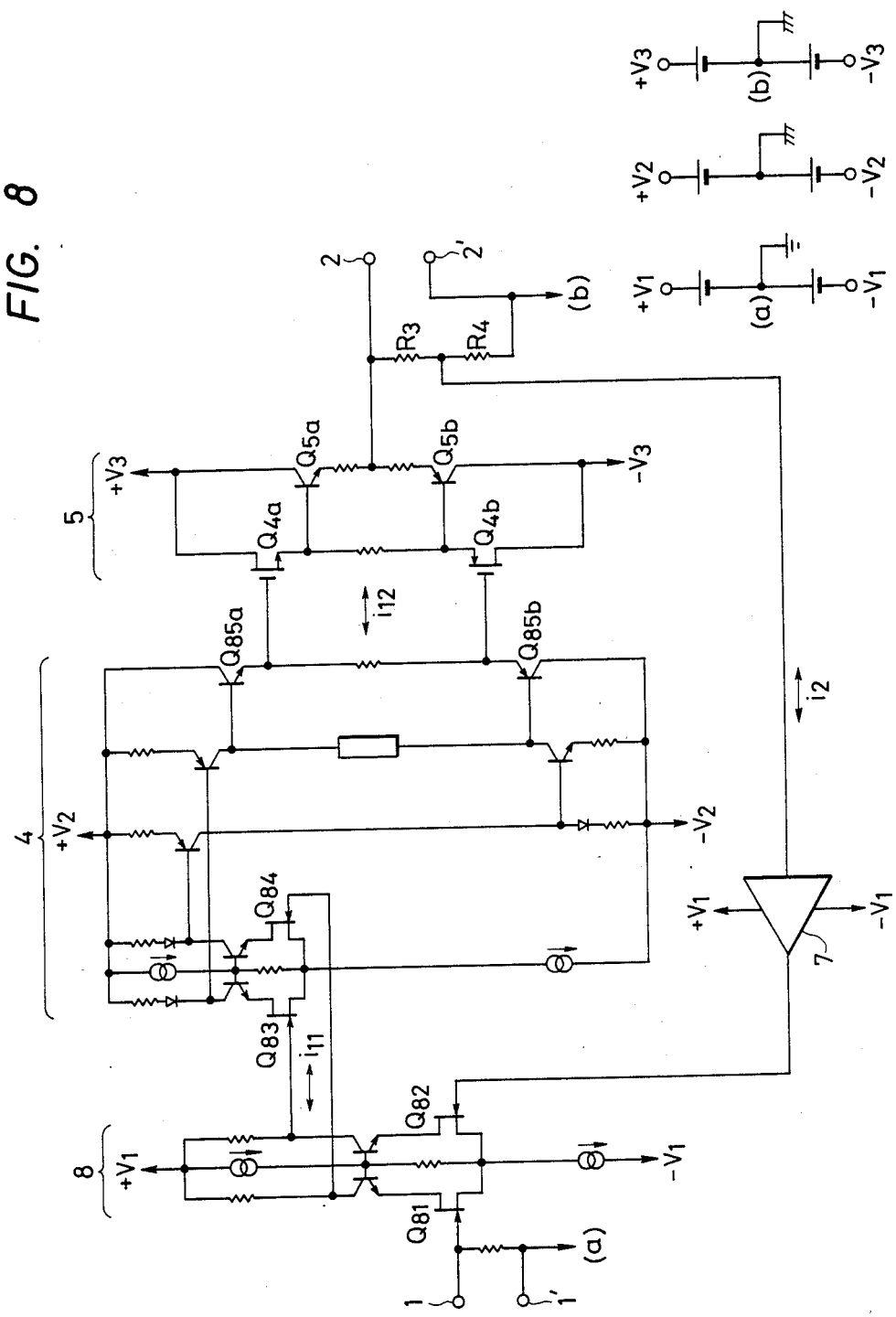

Another example of an amplifier embodying the inventive concept is shown in FIG. 8. In this amplifier, an input signal is applied to a first differential amplifier composed of FETs $Q_{81}$ and $Q_{82}$ driven by power sources $+V_1$ and $-V_1$. The outputs of the first differential amplifier are applied to a second differential amplifier composed of FETs $Q_{83}$ and $Q_{84}$ so that the outputs of the second differential amplifier drive push-pull connected transistors $Q_{85a}$ and $Q_{85b}$ are powered by power sources $+V_2$ and $-V_2$. The outputs of the transistors $Q_{85a}$ and $Q_{85b}$ are applied to MOSFETs $Q_{4a}$ and $Q_{4b}$ to drive push-pull connected transistors $Q_{5a}$ and $Q_{5b}$. The MOSFETs $Q_{4a}$ and $Q_{4b}$ and the transistors $Q_{5a}$ and $Q_{5b}$ are operated by power sources $+V_3$ and $-V_3$.

The output is subjected to voltage division by resistors $R_3$ and $R_4$. The divided voltage is applied to a buffer 7 driven by the power sources $+V_1$ and $-V_1$. The output of the buffer 7 is applied to the FET $Q_{82}$. With the above-described arrangement, the currents $I_{11}$, $I_{12}$ and $I_2$ flowing respectively between the initial amplifying stage 8 (the first differential amplifier FETs $Q_{81}$ and $Q_{82}$) and the voltage amplifying stage 4 (the second differential amplifier FETs $Q_{83}$ and $Q_{84}$ and the push-pull transistors $Q_{85a}$ and $Q_{85b}$), between the voltage amplifying stage 4 and the power amplifying stage 5, and between the power amplifying stage 5 and the buffer 7 are made substantially zero.

As is apparent from the above description, according to the invention, isolated current loops are formed for each of the power source systems so that no current flows between the grounding points. Therefore, the amplifier provided by the invention is an ideal one which is not affected by the impedance of the ground bus or chassis.

I claim:

1. An amplifier operating from a plurality of power sources, comprising:
   a voltage amplifying stage;
   first and second series-connected power sources for supplying operating power to said voltage amplifying circuit, a connecting point of said first and second power sources being connected to a first ground terminal;
   an input resistor connected between a noninverting input terminal of said voltage amplifier and said first ground terminal;
   a power amplifying stage having a high input impedance input buffer, an input terminal of said input buffer being connected to an output terminal of said voltage amplifying stage;
   third and fourth series-connected power sources for supplying operating power to said power amplifying stage, a connecting point of said third and fourth voltage sources being connected to a second ground terminal;
   means for electrically connecting said first and second ground terminals;
   a voltage divider having end terminals connected respectively to an output of said power amplifying stage and said second ground terminal; and
   a high input impedance buffer stage having an input terminal connected to an intermediate point of said voltage divider and an output connected to an inverting input terminal of said voltage amplifying stage.

2. The amplifier of claim 1, wherein said buffer stage is connected to receive operating power from said first and second power sources.

3. The amplifier of claim 1, further comprising a second voltage divider having end terminals connected between said output of said buffer stage and said first ground terminal, an intermediate point of said second voltage divider being connected to said inverting input terminal of said voltage amplifying stage.

4. The amplifier of claim 1, wherein said power amplifying stage comprises a single-ended emitter-follower output stage.

5. The amplifier of claim 1, wherein said power amplifying stage comprises a push-pull circuit.

6. The amplifier of claim 1, wherein said voltage amplifying stage comprises first and second cascade-connected FET amplifying stages followed by at least one bipolar push-pull amplifying stage; and wherein said power amplifier comprises an input push-pull MOSFET stage having inputs coupled to respective outputs of said voltage amplifying stage, followed by a bipolar push-pull stage.

7. An amplifier operating from a plurality of power sources, comprising:
a voltage amplifying stage;
first and second series-connected power sources for supplying operating power to said voltage amplifying stage, said first and second power sources having a connecting point connected to a first ground terminal;
a power amplifying stage;
third and fourth power sources for supplying operating power to said power amplifying stage, a connecting point of said third and fourth voltage sources being connected to a second ground terminal;
means for electrically connecting said first and second ground terminals;
a voltage divider having end terminals respectively connected to an output terminal of said power amplifying stage and said second ground terminal.
a high input impedance buffer having an input terminal connected to an intermediate terminal of said voltage divider of an output terminal connected to an inverting input terminal of said voltage amplifying circuit; and
means for optically coupling an output of said voltage amplifying stage to an input of said power amplifying stage.

8. The amplifier of claim 7, wherein said optical coupling means comprises first and second semiconductor light-emitting means driven in a push-pull manner by an output of said voltage amplifying stage.

9. An amplifier for amplifying an input signal, said amplifier comprising:
a first amplification stage for providing an output in response to first and second inputs and receiving said input signal as its first input, said first amplification stage being electrically grounded at a first ground connection point;
a second amplification stage for providing an output in response to at least one input, said second amplification stage being electrically grounded at a second connection point spaced apart from said first ground connection point;
means for electrically connecting said first and second ground connection points;
first buffer means having a high impedance input and low impedance output for coupling said first amplification stage output to said second amplification stage input; and
second buffer means having a high impedance input and low impedance output for coupling said second amplification stage output to said second input of said first amplification stage.

10. An amplifier as claimed in claim 9, wherein said first amplification stage generates its output from a first power supply means referenced to ground via said first ground connection point and said second buffer means generates its low impedance output from said first power supply means, and wherein said second amplification stage generates its output from a second power supply means referenced to ground via said second ground connection point and said first buffer means generates its low impedance output from said second power supply means.

11. An amplifier operating from a plurality of power sources, comprising:
a voltage amplifying stage having a high input impedance;
first and second series-connected voltage sources for supplying operating power to said voltage amplifying stage, a connecting point of said first and second voltage sources being connected to a first ground terminal;
a power amplifying stage having a high input impedance input buffer, an input terminal of said input buffer being connected to an output terminal of said voltage amplifying stage;
third and fourth series-connected power sources for supplying operating power to said power amplifying stage, a connecting point of said third and fourth voltage sources being connected to a second ground terminal;
means for electrically connecting said first and second ground terminals; and
a voltage divider having end terminals connected respectively to an output of said power amplifying stage and said second ground terminal.

* * * * *